United States Patent
Bota et al.

(10) Patent No.: US 8,274,816 B2
(45) Date of Patent: Sep. 25, 2012

(54) NONVOLATILE MEMORY DEVICE AND INFORMATION RECORDING METHOD

(75) Inventors: Noriko Bota, Kanagawa-ken (JP); Yasuhiro Nojiri, Kanagawa-ken (JP); Hiroyuki Fukumizu, Kanagawa-ken (JE); Takuya Konno, Kanagawa-ken (JP); Kazuhito Nishitani, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/036,667

(22) Filed: Feb. 28, 2011

(65) Prior Publication Data

US 2011/0149638 A1    Jun. 23, 2011

Related U.S. Application Data

(63) Continuation of application No. PCT/JP2008/065601, filed on Aug. 29, 2008.

(51) Int. Cl.
*G11C 11/00* (2006.01)
(52) U.S. Cl. ............... 365/148; 365/189.07; 365/189.16
(58) Field of Classification Search .................. 365/148, 365/189.07, 189.16
See application file for complete search history.

(56) References Cited

U.S. PATENT DOCUMENTS

| | | | |
|---|---|---|---|
| 7,433,222 B2 * | 10/2008 | Hosoi et al. | ........... 365/148 |
| 2004/0114429 A1 | 6/2004 | Ehiro et al. | |
| 2008/0049487 A1 * | 2/2008 | Yoshimura et al. | ........... 365/148 |
| 2010/0046270 A1 * | 2/2010 | Katoh et al. | ........... 365/100 |
| 2011/0110144 A1 * | 5/2011 | Kawai et al. | ........... 365/148 |
| 2011/0182109 A1 * | 7/2011 | Ikeda et al. | ........... 365/148 |
| 2012/0069633 A1 * | 3/2012 | Katoh | ........... 365/148 |

FOREIGN PATENT DOCUMENTS

| JP | 2004-185756 | 7/2004 |
|---|---|---|
| JP | 2006-135335 | 5/2006 |
| JP | 2007-328857 | 12/2007 |

OTHER PUBLICATIONS

Japanese International Search Report issued Mar. 17, 2009 in PCT/JP2008/065601 filed Aug. 29, 2008.
Japanese Written Opinion Report issued Feb. 24, 2009 in PCT/JP2008/065601 filed Aug. 29, 2008.

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

According to one embodiment, a nonvolatile memory device includes a memory layer and a driver section. The memory layer has a first state having a first resistance under application of a first voltage, a second state having a second resistance higher than the first resistance under application of a second voltage higher than the first voltage, and a third state having a third resistance between the first resistance and the second resistance under application of a third voltage between the first voltage and the second voltage. The driver section is configured to apply at least one of the first voltage, the second voltage and the third voltage to the memory layer to record information in the memory layer.

20 Claims, 10 Drawing Sheets

NONVOLATILE MEMORY DEVICE AND INFORMATION RECORDING METHOD

CROSS-REFERENCE TO RELATED APPLICATIONS

This is a continuation application of International Application PCT/JP2008/065601, filed on Aug. 29, 2008; the entire contents of which are incorporated herein by reference.

FIELD

Embodiments described herein relate generally to a nonvolatile memory device and an information recording method.

BACKGROUND

Recently, the market for NAND flash memories has been rapidly expanding due to increased memory capacity and reduced cost. However, NAND flash memories have the problem of increased processing cost due to the limit of miniaturization and the shrinkage of the minimum line width. As a novel nonvolatile memory for solving this problem, a resistance change memory is under development.

The resistance change memory is a nonvolatile memory reversibly switched between a high resistance state and a low resistance state by, for instance, application of voltage to a metal oxide film sandwiched between an upper electrode and a lower electrode.

In a technique for the resistance change memory, at write time for changing the resistance value from the high state to the low state, the resistance value is set to a plurality of different levels to store information having three or more values (see, e.g., JP 2007-328857(Kokai)). In another technique, during the change from one reset state (high resistance state) to two or more set states (low resistance states), the current is adjusted to control the resistance state (see, e.g., JP-A 2006-135335(Kokai)).

However, in these techniques of setting the resistance value to a plurality of levels at write time for changing the resistance value from the high state to the low state, an active element such as a transistor is required to limit the current at write time. This complicates the configuration and interferes with increasing the memory density. Furthermore, the voltage at write time typically has large variations and is difficult to control.

DETAILED DESCRIPTION

Figure 1:
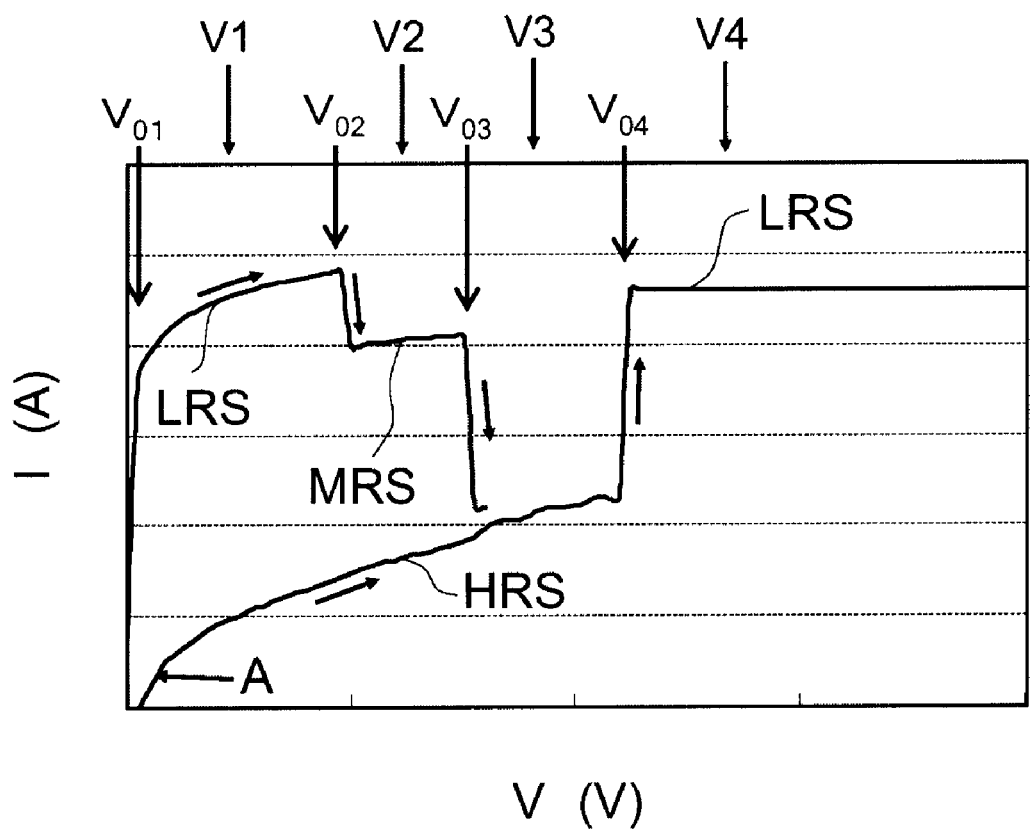
FIG. 1 is a schematic diagram illustrating the characteristics of a nonvolatile memory device according to a first embodiment.

In general, according to one embodiment, a nonvolatile memory device includes a memory layer and a driver section. The memory layer has a first state having a first resistance under application of a first voltage, a second state having a second resistance higher than the first resistance under application of a second voltage higher than the first voltage, and a third state having a third resistance between the first resistance and the second resistance under application of a third voltage between the first voltage and the second voltage. The driver section is configured to apply at least one of the first voltage, the second voltage and the third voltage to the memory layer to record information in the memory layer.

Various embodiments will be described hereinafter with reference to the accompanying drawings.

In the specification and the drawings, components similar to those described previously with reference to earlier figures are labeled with like reference numerals, and the detailed description thereof is omitted as appropriate.

First Embodiment

FIG. 1 is a schematic diagram illustrating the characteristics of a nonvolatile memory device according to a first embodiment.

Figure 2A:
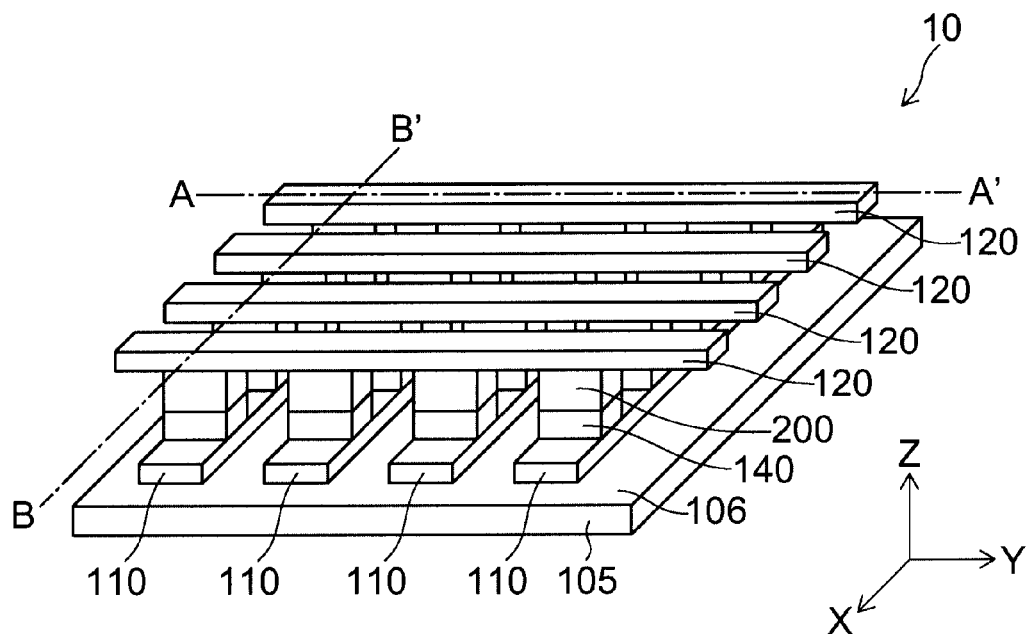
FIGS. 2A and 2B are schematic views illustrating a partial configuration of the nonvolatile memory device according to the first embodiment.
Figure 2B:
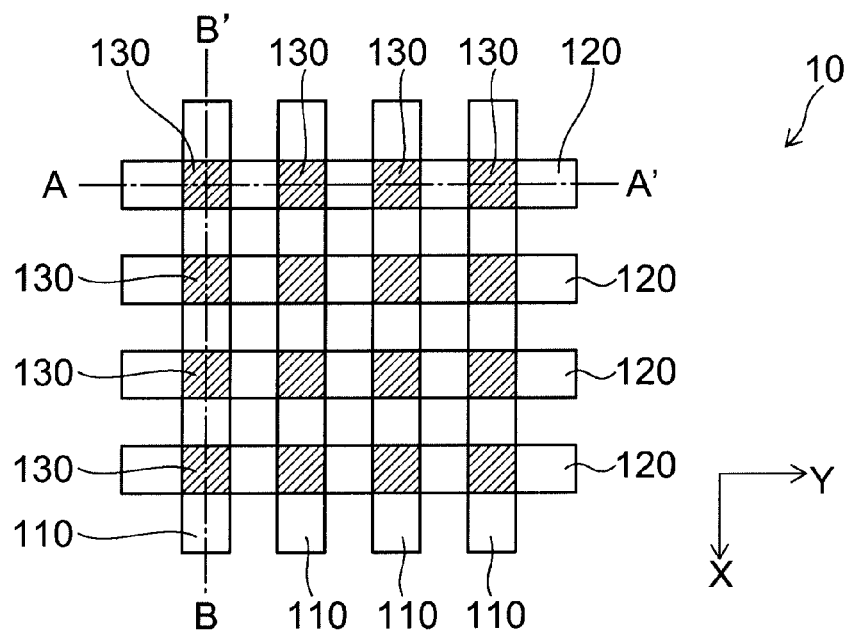

FIGS. 2A and 2B are schematic views illustrating a partial configuration of the nonvolatile memory device according to the first embodiment.

Figure 3A:
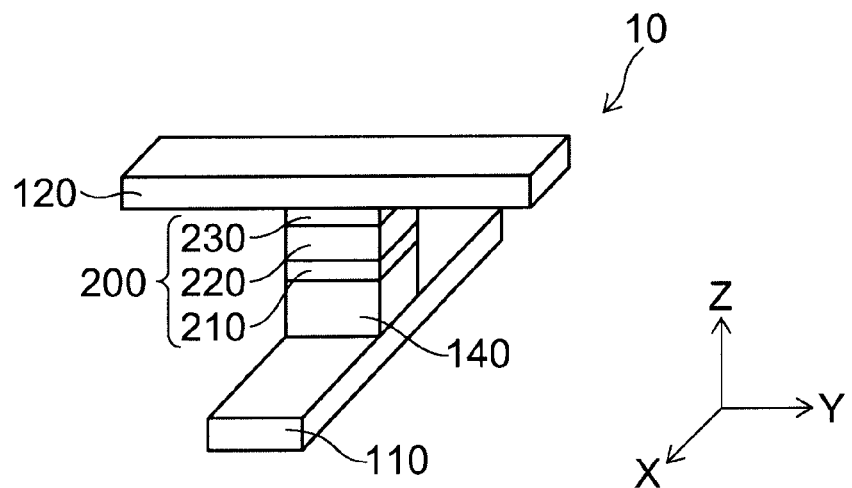
FIGS. 3A to 3C are schematic views illustrating a partial configuration of the nonvolatile memory device according to the first embodiment.
Figure 3B:
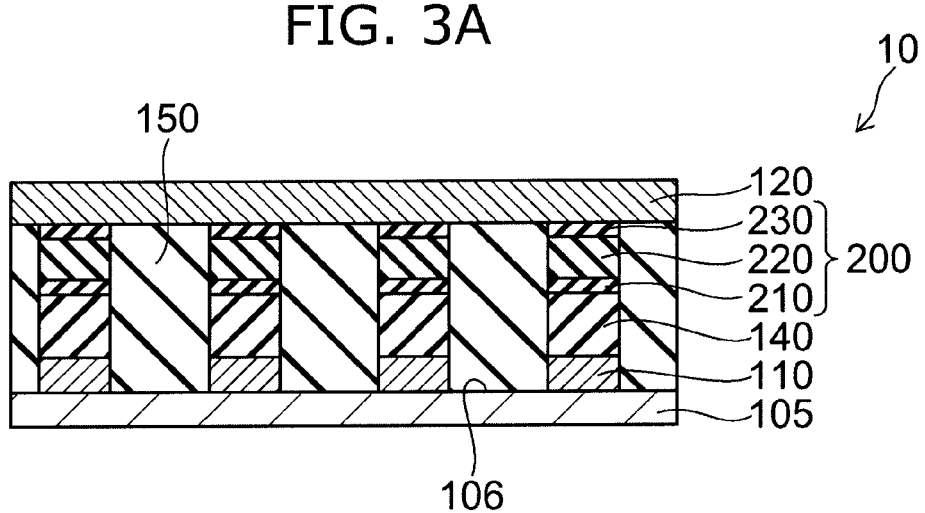
Figure 3C:
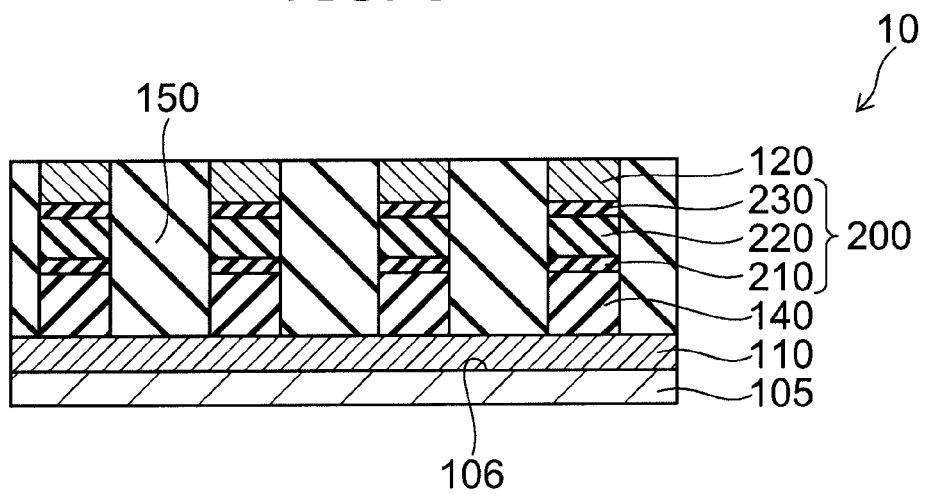

FIGS. 3A to 3C are schematic views illustrating a partial configuration of the nonvolatile memory device according to the first embodiment.

Figure 4:
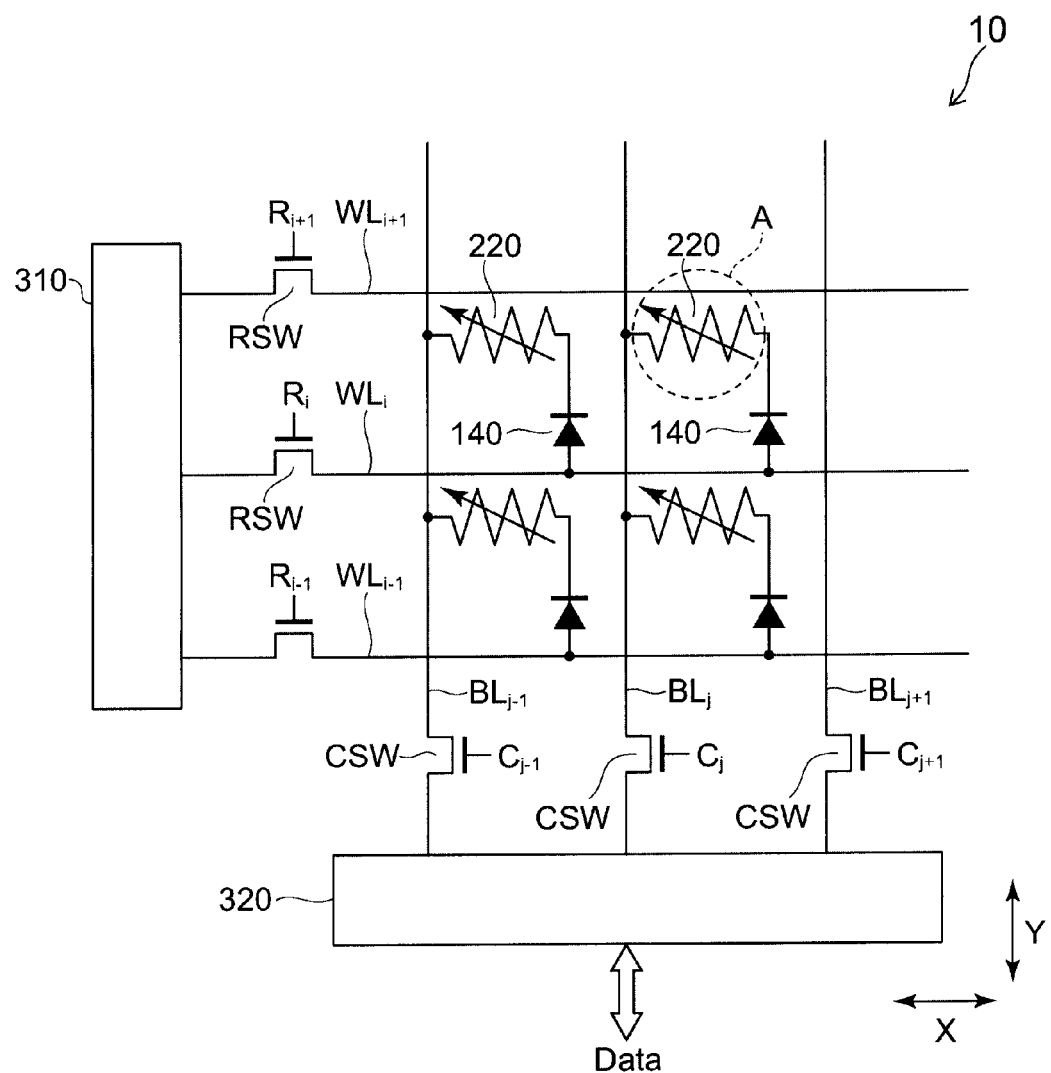
FIG. 4 is a schematic circuit diagram illustrating the configuration of the nonvolatile memory device according to the first embodiment.

FIG. 4 is a schematic circuit diagram illustrating the configuration of the nonvolatile memory device according to the first embodiment.

Figure 5A:
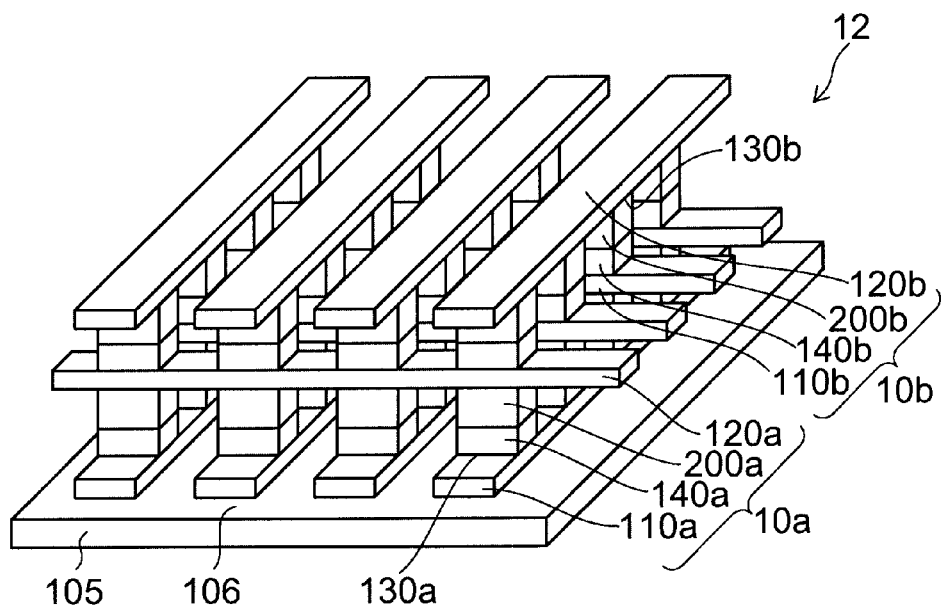
FIGS. 5A and 5B are schematic views illustrating the configuration of alternative nonvolatile memory devices according to the first embodiment.
Figure 5B:
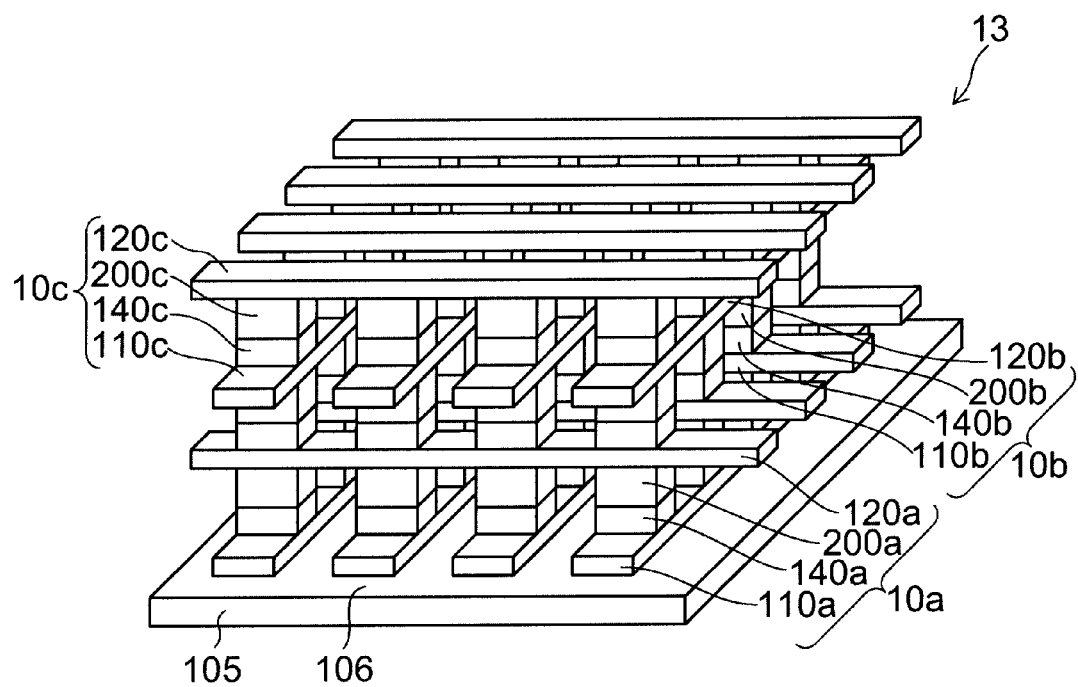

FIGS. 5A and 5B are schematic views illustrating the configuration of alternative nonvolatile memory devices according to the first embodiment.

The nonvolatile memory device 10 according to the first embodiment includes a memory layer with changing resistance, and a driver section for applying voltage to the memory layer for recording.

First, the general configuration of the nonvolatile memory device 10 according to the first embodiment is described with reference to FIGS. 2A to 4.

FIG. 2A illustrates the configuration of a cell region of the nonvolatile memory device according to the embodiment. As shown in this figure, in the nonvolatile memory device 10 according to the embodiment, for instance, striped first interconnects 110 extending in the X-axis direction are provided on the major surface 106 of a substrate 105. Furthermore, striped second interconnects 120 extending in the Y-axis direction orthogonal to the X-axis direction in a plane parallel to the substrate 105 are opposed to the first interconnects 110.

The substrate 105 can be e.g. a silicon substrate. The substrate 105 can also include a driver circuit (the driver section described later) for driving the nonvolatile memory device 10. The first interconnect 110 and the second interconnect 120 can be made of a material such as tungsten, tungsten silicide, and tungsten nitride.

FIG. 2B is a schematic plan view as viewed in the Z-axis direction orthogonal to the X-axis and the Y-axis. As shown in this figure, in the nonvolatile memory device 10, a cell 130 to be recorded with information is formed in a region where the first interconnect 110 and the second interconnect 120 are opposed to each other.

Although FIGS. 2A and 2B show an example including four first interconnects 110 and four second interconnects 120, the embodiment is not limited thereto. The number of first interconnects 110 and second interconnects 120 is arbitrary. Furthermore, for instance, the first interconnect 110 is used as a bit line (BL), and the second interconnect 120 is used as a word line (WL). However, the first interconnect 110 may be used as a word line (WL), and the second interconnect 120 may be used as a bit line (BL).

FIG. 3A partly illustrates one cell in the nonvolatile memory device 10. On the other hand, FIG. 3B is a sectional view taken along line A-A' of FIGS. 2A and 2B, and FIG. 3C is a sectional view taken along line B-B' of FIGS. 2A and 2B.

As shown in FIGS. 3A to 3C, a memory section 200 is sandwiched between the first interconnect 110 and the second interconnect 120. That is, in the nonvolatile memory device 10, a memory section 200 is provided in the portion (crosspoint) between the bit line and the word line crossing three-dimensionally. Depending on the combination of the potential applied to the first interconnect 110 and the potential applied to the second interconnect 120, the voltage applied to each memory section 200 changes. By the characteristics of the memory section 200 in response thereto, information can be stored.

A device isolation insulating layer 150 is provided in the region outside the portion where the first interconnect 110 and the second interconnect 120 are opposed to each other. It is noted that in FIGS. 2A to 3A, the device isolation insulating layer 150 is not shown.

To impart directionality to the polarity of the voltage applied to the memory section 200, for instance, a switching element section 140 having rectifying characteristics can be provided. The switching element section 140 can include e.g. a PIN diode or a MIM (metal-insulator-metal) element.

In the specific example illustrated in FIGS. 2A to 3C, the switching element section 140 is provided between the first interconnect 110 and the memory section 200. However, the switching element section 140 may be provided between the second interconnect 120 and the memory section 200. Alternatively, the switching element section 140 may be provided in a region other than the region where the first interconnect 110 and the second interconnect 120 are opposed to each other.

Here, a barrier metal layer, not shown, can be provided between the first interconnect 110 and the switching element section 140, between the switching element section 140 and the memory section 200, and between the memory section 200 and the second interconnect 120. The barrier metal layer can be made of a material such as titanium (Ti) and titanium nitride (TiN).

Here, one memory section 200 provided in the region between one first interconnect 110 and one second interconnect 120 crossing three-dimensionally, corresponds to one memory element and constitutes one cell 130. That is, the nonvolatile memory device 10 includes a plurality of cells 130 for storing information. The region including these cells 130 is referred to as a cell region.

As shown in FIGS. 3A to 3C, the memory section 200 includes a first electrode 210, a second electrode 230, and a memory layer 220 provided between the first electrode 210 and the second electrode 230. The first electrode 210 and the second electrode 230 can double as the first interconnect 110, the second interconnect 120, the layer constituting the switching element section 140, and the respective barrier metal layers, and can be omitted.

The memory layer 220 is made of a material realizing different resistance states depending on the application voltage. The memory layer 220 is further described later.

FIG. 4 illustrates a circuit configuration of the nonvolatile memory device according to the embodiment. Although this figure depicts three word lines and three bit lines, the number of word lines and bit lines is arbitrary.

As shown in FIG. 4, for instance, one end of the word lines $WL_{i-1}$, $WL_i$, $WL_{i+1}$ is connected through a MOS transistor RSW as a select switch to a word line driver 310 having decoder functionality. One end of the bit lines $BL_{j-1}$, $BL_j$, $BL_{j+1}$ is connected through a MOS transistor CSW as a select switch to a bit line driver 320 having decoder and read functionality.

The gate of the MOS transistor RSW is inputted with a select signal $R_{i-1}$, $R_{i+1}$ for selecting one word line (row). The gate of the MOS transistor CSW is inputted with a select signal $C_{j-1}$, $C_j$, $C_{j+1}$ for selecting one bit line (column).

The memory layer 220 (memory section 200) is located at the intersection of the word line $WL_{i-1}$, $WL_i$, $WL_{i+1}$ and the bit line $BL_{j-1}$, $BL_j$, $BL_{j+1}$. That is, the so-called cross-point cell array structure is implemented.

As described above, the cell 130 can be added with a rectifying element section 140 for preventing sneak current during recording/reproduction.

As described above with reference to FIGS. 2A and 2B, the memory section 200 (memory layer 220) and the rectifying element section 140 are provided between the word line $WL_i$ and the bit line $BL_j$.

Furthermore, as shown in FIG. 5A, in an alternative nonvolatile memory device 12 according to the embodiment, the first interconnects 110, the memory sections 200, and the second interconnects 120 are stacked in two layers.

As shown in FIG. 5B, in an alternative nonvolatile memory device 13 according to the embodiment, the first interconnects 110, the memory sections 200, and the second interconnects 120 are stacked in three layers.

Thus, in the nonvolatile memory device according to the embodiment, the number of stacked layers of the memory sections 200 (memory layers 220) is arbitrary. The memory sections 200 can be stacked in many layers to increase the memory density.

In the following, for simplicity of description, the nonvolatile memory device 10 with one stacked layer of the memory sections 200 is described.

FIG. 1 illustrates the characteristics of the memory layer 220 in the nonvolatile memory device 10 according to the embodiment. In this figure, the horizontal axis represents the voltage V applied to the memory layer 220, and the vertical axis represents the current I flowing in the memory layer 220.

As shown in FIG. 1, from the state indicated by arrow A (high resistance state HRS), the voltage V applied to the memory layer 220 is increased. Then, at voltage $V_{04}$, the resistance of the memory layer 220 sharply decreases to the low resistance state LRS. After the change to this state, if the application voltage V is decreased, the low resistance state LRS is maintained.

Then, when the application voltage V to the memory layer 220 is increased again from 0 V (voltage $V_{01}$), the low resistance state LRS is maintained below voltage $V_{02}$.

Then, at voltage $V_{02}$, the resistance changes to a medium resistance state MRS having a resistance higher than the low resistance state LRS and lower than the high resistance state HRS.

Then, when the application voltage V continues to be increased, the medium resistance state MRS is maintained if the application voltage is lower than voltage $V_{03}$.

Then, at voltage $V_{03}$, the resistance changes from the medium resistance state MRS to the high resistance state HRS.

Thus, in the nonvolatile memory device 10 according to the embodiment, the resistance transfers from the low resistance state LRS to the high resistance state HRS. In this process, the resistance exhibits the low resistance state LRS when the application voltage to the memory layer 220 is in the voltage range from voltage $V_{01}$ to voltage $V_{02}$. The resistance exhibits the medium resistance state MRS in the voltage range from voltage $V_{02}$ to voltage $V_{03}$. The resistance exhibits the high resistance state HRS in the voltage range from voltage $V_{03}$ to voltage $V_{04}$.

That is, the low resistance state LRS, the medium resistance state MRS, and the high resistance state HRS occur in this order with the increase of the application voltage to the memory layer 220.

In the nonvolatile memory device 10 according to the embodiment, the word line driver 310 and the bit line driver 320 serving as a driver section apply a prescribed voltage to the memory layer 220 realizing these three states to record information in the memory layer 220. Furthermore, the recorded information is read.

Here, as illustrated in FIG. 1, a voltage having a value between voltage $V_{01}$ and voltage $V_{02}$ is referred to as voltage V1 (first voltage). A voltage having a value between voltage $V_{02}$ and voltage $V_{03}$ is referred to as voltage V2 (third voltage). A voltage having a value between voltage $V_{03}$ and voltage $V_{04}$ is referred to as voltage V3 (second voltage). A voltage having a value higher than voltage $V_{04}$ is referred to as voltage V4 (fourth voltage).

When information is recorded (rewritten) in one memory layer 220 of interest, for instance, the voltage can be applied thereto as shown in TABLE 1.

TABLE 1

| Current state | Rewritten state | | |
|---|---|---|---|
| | HRS | MRS | LRS |
| HRS | V3 | V4→V2 | V4 |
| MRS | V3 | V2 | V3→V4 |
| LRS | V3 | V2 | V3→V4 |

First, the current resistance state is read. Then, the application voltage is varied as follows based on the current resistance state read.

For instance, if the current state read is the high resistance state HRS and the rewritten state is the high resistance state HRS, then the voltage V3 is applied. If the current state is the high resistance state HRS and the rewritten state is the medium resistance state MRS, then the voltage V4 is applied and then the voltage V3 is applied so that the resistance changes through the low resistance state LRS to the medium resistance state MRS. If the current state is the high resistance state HRS and the rewritten state is the low resistance state LRS, then the voltage V4 is applied.

On the other hand, for instance, if the current state is the medium resistance state MRS and the rewritten state is the high resistance state HRS, then the voltage V3 is applied. If the current state is the medium resistance state MRS and the rewritten state is the medium resistance state MRS, then the voltage V2 is applied. If the current state is the medium resistance state MRS and the rewritten state is the low resistance state LRS, then the voltage V3 is applied and then the voltage V4 is applied so that the resistance changes through the high resistance state HRS to the low resistance state LRS.

On the other hand, for instance, if the current state is the low resistance state LRS and the rewritten state is the high resistance state HRS, then the voltage V3 is applied. If the current state is the low resistance state LRS and the rewritten state is the medium resistance state MRS, then the voltage V2 is applied. If the current state is the low resistance state LRS and the rewritten state is the low resistance state LRS, then the voltage V3 is applied and then the voltage V4 is applied so that the resistance changes through the high resistance state HRS to the low resistance state LRS.

That is, the driver section reads the resistance state of the memory layer 220, and records information in the memory layer 220 by varying the voltage based on the resistance state read Thus, the three states can be arbitrarily rewritten to each other.

Here, the foregoing is illustrative only, and writing may be performed by other methods.

For instance, in rewriting from an arbitrary state to an arbitrary state, V4 may be always applied once, and then a voltage for changing to a given state may be applied.

That is, the driver section can apply the voltage V4 to the memory layer 220. The voltage V4 is equal to or higher than the voltage (voltage $V_{04}$) at which the memory layer 220 changes from the high resistance state HRS to the low resistance state LRS. Then, the driver section can apply the third voltage (voltage V2) to the memory layer 220.

At read (reproduction) time, reading can be performed by applying the voltage V1, which is a voltage leaving the low resistance state LRS unchanged.

Such writing (recording) of information is performed by the word line driver 310 and the bit line driver 320 serving as a driver section. In the specific example, the word line driver 310 and the bit line driver 320 serving as a driver section apply a prescribed voltage through the word line $WL_i$ and the bit line $BL_j$ to the memory layer 220 realizing these three or more states to record information in the memory layer 220. Furthermore, the recorded information is read.

In the nonvolatile memory device 10 according to the embodiment, the memory layer 220 is made of e.g. a compound containing different kinds of metal elements and oxygen.

For instance, the memory layer 220 is made of a compound composed of Ni, Ti, and O. The first electrode 210 and the second electrode 230 are made of Pt. However, the embodiment is not limited thereto. The material used is arbitrary as long as a medium resistance state MRS occurs between the high resistance state HRS and the low resistance state LRS.

In the specific example, the memory layer 220 has three states, i.e., the high resistance state HRS, the low resistance state LRS, and the medium resistance state MRS. Thus, a three-valued state is recorded per one memory layer 220.

However, the embodiment is not limited thereto. The memory layer 220 can have four or more states.

That is, as described later, the medium resistance state MRS may include an arbitrary number of medium resistance states (first to Nth medium resistance states, N being an integer of one or more) having different resistances. In this case, as illustrated in TABLE 1, the states can be arbitrarily rewritten to each other by setting application voltages so as to correspond to the respective medium resistance states.

Furthermore, as described later, the medium resistance states (first to Nth medium resistance states, N being an integer of one or more) having different resistances may change in a discontinuous and stepwise manner as illustrated in FIG. 1. Alternatively, as described later, the medium resistance state may change continuously and gradually with the increase of application voltage.

The aforementioned voltage application is performed with a pulse-like voltage. Here, the resistance state can be controlled by the voltage value of the pulse (height of the pulse) as described above. Alternatively, the resistance state can be controlled also by the time width of the pulse (the duration of voltage application). For instance, the resistance state can be controlled by varying the duty ratio of the pulse. Alternatively, the shape of the pulse waveform may be varied.

Thus, the nonvolatile memory device 10 according to the embodiment can provide a nonvolatile memory device of the resistance change type facilitating increasing the memory density, having high controllability, and being capable of multivalued recording.

First Practical Example

In a nonvolatile memory device according to a first practical example, the memory layer 220 was made of metal oxide NiO doped with Ti. Specifically, first, a film of Pt was formed as a lower electrode (first electrode 210). Then, by reactive sputtering in an Ar/O$_2$ atmosphere, Ti and Ni were simultaneously sputtered. Annealing was performed in an N$_2$ atmosphere at 400° C. for 10 minutes. Here, the doping amount of Ti was 4.16%. Subsequently, a film of Pt was formed thereon as an upper electrode (second electrode 230). Then, with the lower electrode placed at the ground potential, a positive voltage was applied to the upper electrode to evaluate the current-voltage characteristics of the memory layer 220 under unipolar operation. The result is as follows.

Figure 6:
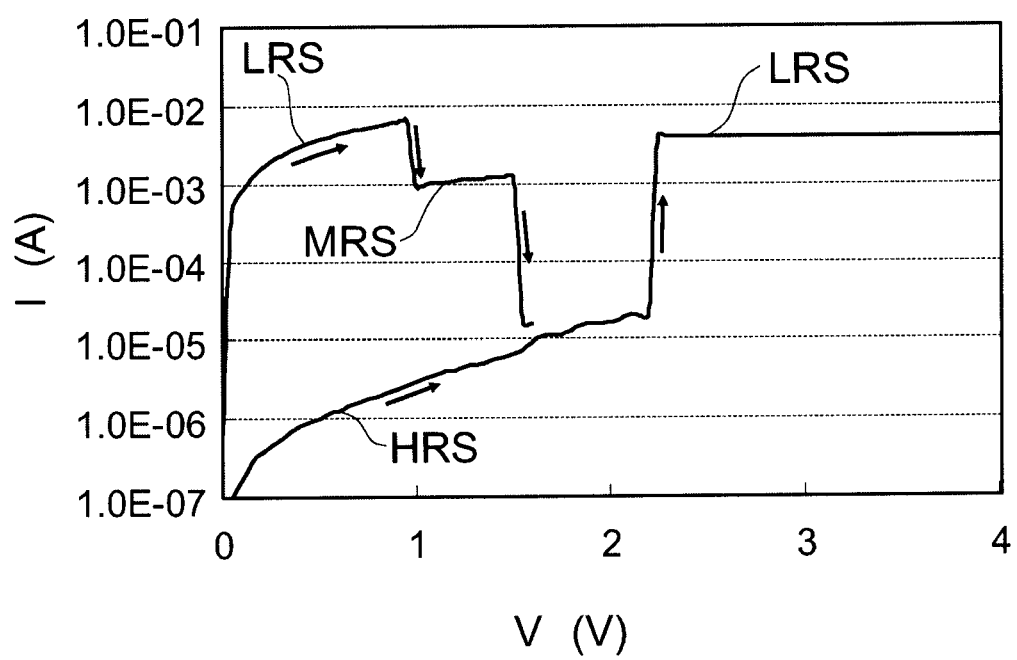
FIG. 6 is a graph illustrating the characteristics of a nonvolatile memory device according to a first practical example.

FIG. 6 is a graph illustrating the characteristics of the nonvolatile memory device according to the first practical example.

As shown in FIG. 6, in the nonvolatile memory device 10a according to the first practical example, the resistance changes in two stages during transfer from the low resistance state LRS to the high resistance state HRS. More specifically, when the application voltage is increased from 0 V, the resistance changes to the medium resistance state MRS at approximately 1.0 V. When the application voltage is increased from that state, the resistance changes to the high resistance state HRS at approximately 1.5 V.

During the aforementioned increase of application voltage, after applying voltage V1 having a value between 0 V and 1 V, if the application voltage is set to 0 V, the low resistance state LRS is maintained.

After change to the medium resistance state MRS by applying voltage V2 having a value of 1.0-1.5 V, if the application voltage is decreased from the voltage V2, the medium resistance state MRS is maintained. After change to the high resistance state HRS by applying voltage V3 having a value of 1.5-2.2 V, if the application voltage is decreased from the voltage V3, the high resistance state HRS is maintained.

Thus, the three states can be realized with good controllability.

Here, after change to the high resistance state HRS, if the voltage is once decreased to 0 V, and the application voltage is subsequently increased, then the resistance changes to the low resistance state LRS at approximately 2.2 V. Alternatively, from the low resistance state LRS, the application voltage can be increased to change the resistance through the medium resistance state MRS to the high resistance state HRS. Also in this case, the resistance transfers again to the low resistance state LRS at approximately 2.2 V.

In the nonvolatile memory device 10a based on the memory layer 220 having such characteristics, for instance, the voltage illustrated in TABLE 1 can be applied to realize transfer to arbitrary states. Thus, three-valued information can be recorded. Furthermore, the recorded information can be reproduced.

Here, the aforementioned film serving as the memory layer 220 may be formed as follows. For instance, after the lower electrode is formed, a thin film of Ti is formed. Subsequently, an NiO film is formed, and then annealed to diffuse Ti into the NiO film. Thus, a memory layer 220 including Ti, Ni, and O can be formed. Alternatively, for instance, the film serving as the lower electrode is formed by simultaneously sputtering Pt and Ti. Subsequently, an NiO film is formed thereon and annealed so that Ti in the film serving as the lower electrode diffuses into the NiO film. Thus, a memory layer 220 including Ti, Ni, and O can be formed.

Comparative Example

Figure 7A:
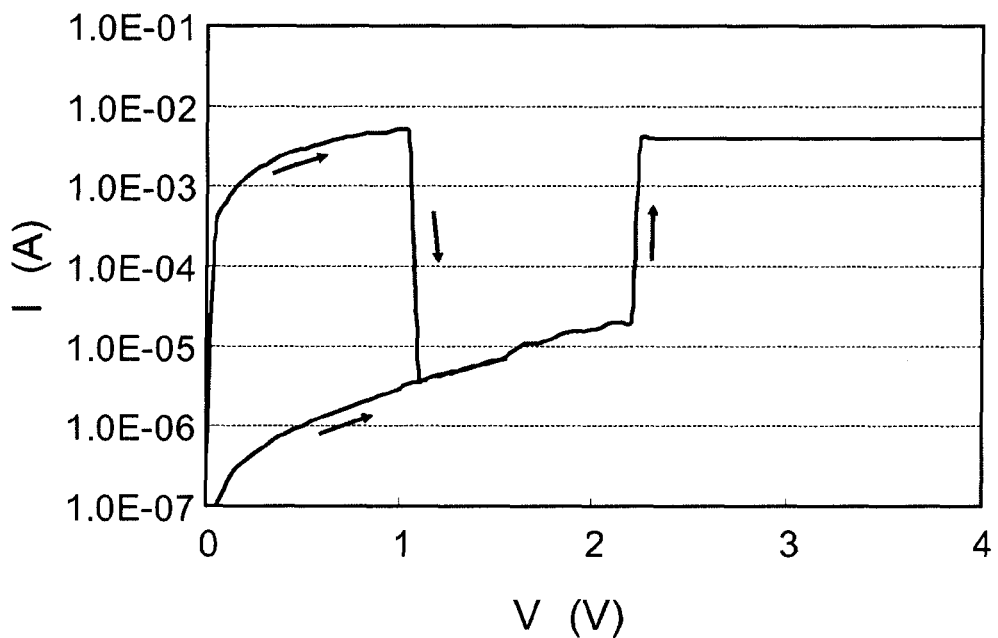
FIGS. 7A and 7B are graphs illustrating the characteristics of nonvolatile memory devices of comparative examples.
Figure 7B:
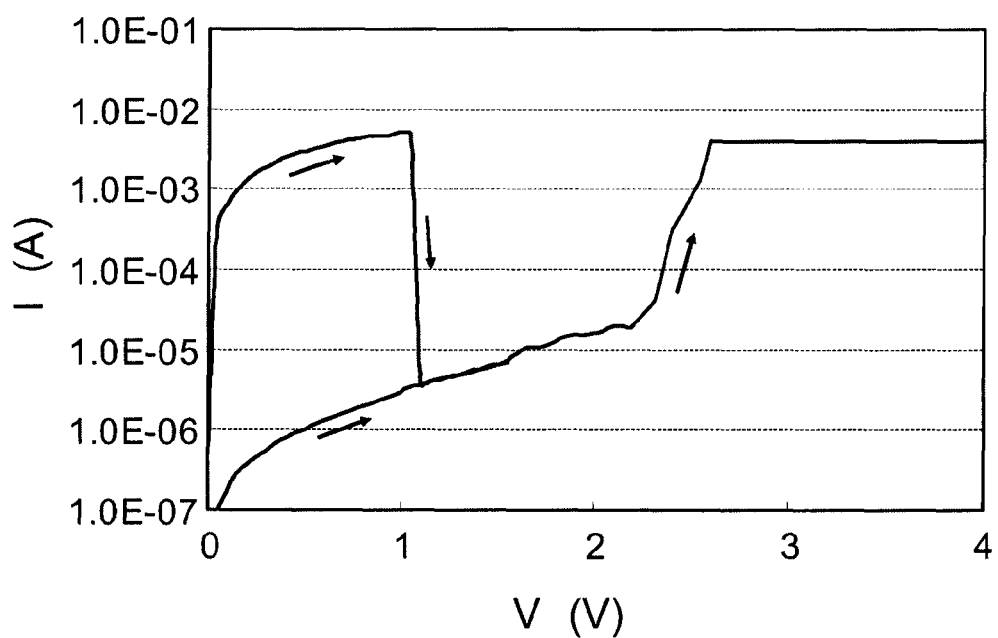

FIGS. 7A and 7B are graphs illustrating the characteristics of nonvolatile memory devices according to comparative examples.

More specifically, FIG. 7A shows the current-voltage characteristics of a first comparative example in which the memory layer 220 is made of NiO. As shown in FIG. 7A, the first comparative example virtually has only two states, i.e., high resistance state HRS and low resistance state LRS. In this case, only binary information can be recorded per one memory layer 220. Indeed, in the memory layer 220 having such characteristics, a current limiting circuit and a current limiting element can be provided to record states having three or more values. However, this complicates the configuration and increases the element area.

On the other hand, as shown in FIG. 7B, in the second comparative example, a medium resistance state MRS occurs in the change from the high resistance state HRS to the low resistance state LRS with the increase of application voltage. In this case, three states, i.e., the high resistance state HRS, the medium resistance state MRS, and the low resistance state LRS can be written and stored. However, typically, there are large variations in the voltage (generally referred to as set voltage) for the change from the high resistance state HRS to the low resistance state LRS with the increase of application voltage, and the voltage is difficult to control. Furthermore, also in this case, as described with reference to Patent Document 1 and Patent Document 2, a circuit or element for limiting the current at write time can be provided. However, this complicates the configuration and interferes with increasing the memory density.

In contrast, the nonvolatile memory device 10 according to the embodiment is based on a memory layer 220 in which a medium resistance state MRS occurs in the change from the low resistance state LRS to the high resistance state HRS with the increase of application voltage. This makes it possible to provide a nonvolatile memory device of the resistance change type facilitating increasing the memory density, having high controllability, and being capable of multivalued recording.

Second Practical Example

In a nonvolatile memory device 10b according to a second practical example, the memory layer 220 was made of a Zn—Mn—O ternary metal oxide film. More specifically, a film of TiN was formed as a lower electrode. Subsequently, a Zn—Mn—O film serving as a memory layer 220 was formed by sputtering. Here, in the practical example, the composition ratio was set to Zn:Mn:O=1:1.5:4. Subsequently, a film of Pt was formed as an upper electrode. Then, with the lower electrode placed at the ground potential, a positive voltage was applied to the upper electrode to evaluate the current-voltage characteristics of the memory layer 220 under unipolar operation. The result is as follows.

Figure 8:
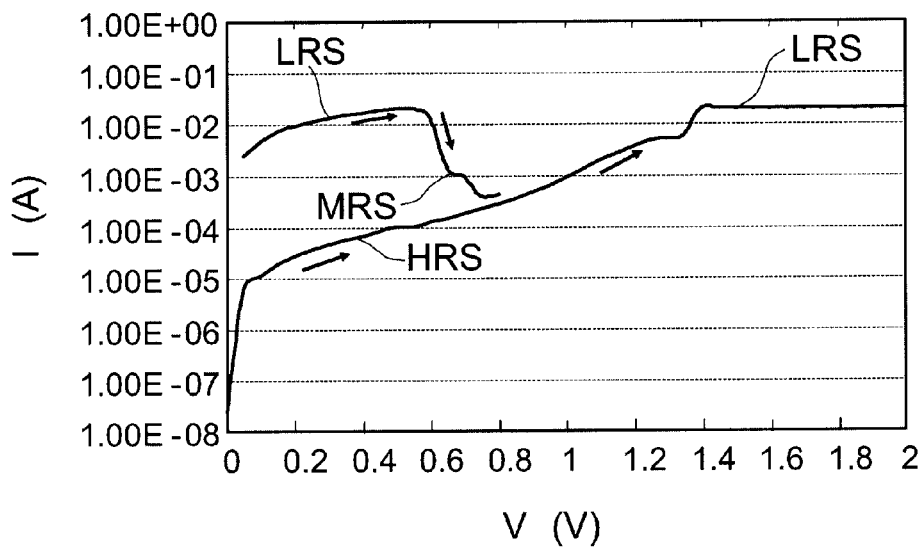
FIG. 8 is a graph illustrating the characteristics of a nonvolatile memory device according to a second practical example.

FIG. 8 is a graph illustrating the characteristics of the nonvolatile memory device according to the second practical example.

As shown in FIG. 8, also in the nonvolatile memory device 10b according to the second practical example, a medium resistance state MRS occurs in the transfer from the low resistance state LRS to the high resistance state HRS with the increase of application voltage.

In the nonvolatile memory device 10a according to the first practical example illustrated in FIG. 6, the change from the low resistance state LRS to the medium resistance state MRS, and the change from the medium resistance state MRS to the high resistance state HRS are discontinuous and stepwise. However, in the practical example, the change from the low resistance state LRS to the medium resistance state MRS, and the change from the medium resistance state MRS to the high resistance state HRS are relatively continuous, and the resistance increases somewhat gradually with the increase of voltage.

In the practical example, for instance, voltage V1 is set to a value of 0-0.3 V, voltage V2 is set to 0.68 V, voltage V3 is set to 1 V, and voltage V4 is set to 1.6 V. By operation under the condition illustrated in TABLE 1, for instance, three-valued information can be recorded. Furthermore, the recorded information can be reproduced.

Thus, in the nonvolatile memory device according to the embodiment, medium resistance states (first to Nth medium resistance states, N being an integer of one or more) having different resistances occur in the change from the low resistance state LRS to the high resistance state HRS with the increase of voltage. Here, the medium resistance states MRS may change relatively continuously without distinct separation therebetween. That is, if there are ranges of application voltage having different rates of change of resistance in response to the change of application voltage, the respective ranges of application voltage can be regarded as the low resistance state LRS, the first to Nth medium resistance states, and the high resistance state HRS. These states can be arbitrarily rewritten to each other.

For instance, in the practical example, the ranges having different rates of change of resistance in response to the change of voltage can be 0-0.56 V (low resistance state LRS), 0.56-0.65 V, 0.65-0.69 V (medium resistance state MRS), 0.69-0.75 V, 0.75-1.42 V (high resistance state HRS), and 1.4 V or more (low resistance state LRS).

Then, voltage V1 at 0-0.56 V (low resistance state LRS), voltage V2 at 0.65-0.69 V (medium resistance state MRS), voltage V3 at 0.75-1.42 V (high resistance state HRS), and voltage V4 at 1.4 V or more (low resistance state LRS) are used. Thus, under the condition illustrated in TABLE 1, for instance, three-valued information can be arbitrarily recorded. Furthermore, the recorded information can be read.

In the foregoing, the composition ratio of the memory layer 220 is set to Zn:Mn:O=1:1.5:4. However, the composition ratio is not limited thereto, but other composition ratios may be used.

Third Practical Example

As a nonvolatile memory device 10c according to a third practical example, a film made of MnOx was used for the memory layer 220. The lower electrode and the upper electrode were made of Pt. The current-voltage characteristics of the memory layer 220 having such configuration were evaluated. The result is as follows.

Figure 9:
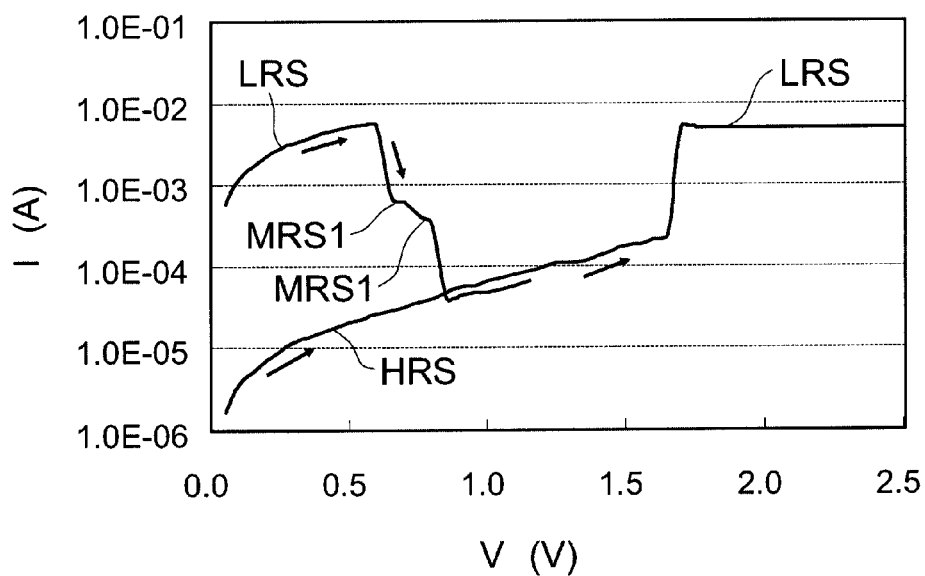
FIG. 9 is a graph illustrating the characteristics of a nonvolatile memory device according to a third practical example.

FIG. 9 is a graph illustrating the characteristics of the nonvolatile memory device according to the third practical example.

As shown in FIG. 9, in the nonvolatile memory device 10c according to the third practical example, two medium resistance states, i.e., first medium resistance state MRS1 and second medium resistance state MRS2, occur in the transfer from the low resistance state LRS to the high resistance state HRS with the increase of voltage.

That is, with the increase of application voltage, the low resistance state LRS changes to the first medium resistance state MRS1, the second medium resistance state MRS2, and the high resistance state HRS. Thus, the nonvolatile memory device 10c according to the practical example has four resistance states.

Application voltages realizing these four resistance states can be used. By operation under the condition extended from TABLE 1, for instance, the four states can be arbitrarily recorded. Furthermore, the recorded information can be reproduced.

Thus, the nonvolatile memory device 10c according to the practical example can provide a nonvolatile memory device of the resistance change type being capable of four-valued recording, facilitating increasing the memory density, and having high controllability.

Second Embodiment

Figure 10:
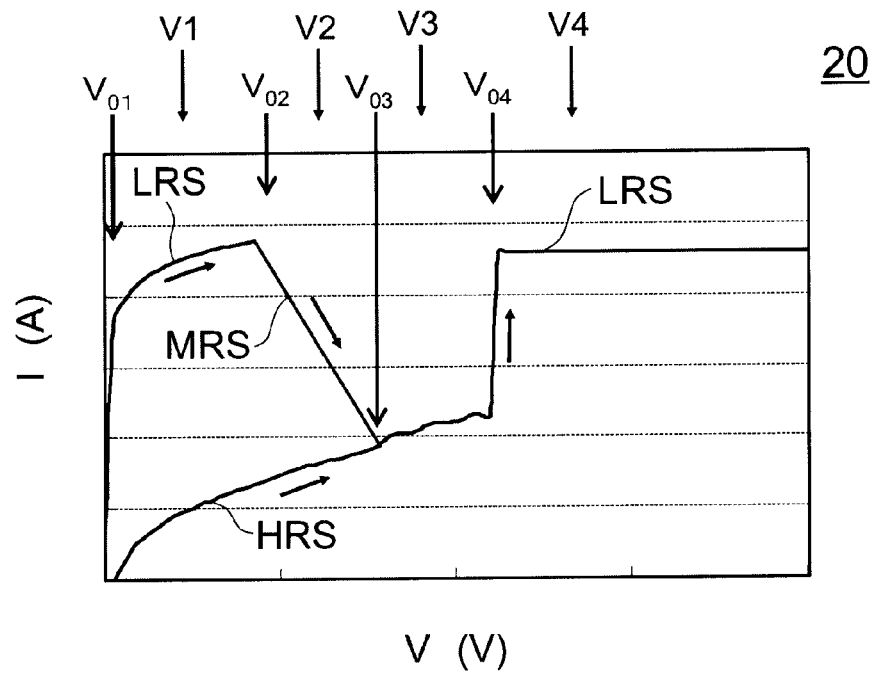
FIG. 10 is a schematic diagram illustrating the characteristics of a nonvolatile memory device according to a second embodiment.

FIG. 10 is a schematic diagram illustrating the characteristics of a nonvolatile memory device according to a second embodiment.

More specifically, this figure illustrates the characteristics of the memory layer 220 in the nonvolatile memory device 20 according to the embodiment. The horizontal axis represents the voltage V applied to the memory layer 220, and the vertical axis represents the current I flowing in the memory layer 220.

The configuration of the nonvolatile memory device 20 according to the embodiment can be made similar to that of the nonvolatile memory device 10 according to the first embodiment, and hence the description thereof is omitted.

As shown in FIG. 10, in the memory layer 220 of the nonvolatile memory device 20 according to the embodiment, with the increase of application voltage, the resistance transfers from the low resistance state LRS to the high resistance state HRS. In this process, the resistance exhibits the low resistance state LRS when the application voltage to the memory layer 220 is in the voltage range from voltage $V_{01}$ to voltage $V_{02}$. The resistance exhibits the high resistance state HRS in the voltage range from voltage $V_{03}$ to voltage $V_{04}$.

Furthermore, in the voltage range from voltage $V_{O2}$ to voltage $V_{O3}$, the resistance exhibits the medium resistance state MRS, which is a resistance state between the low resistance state LRS and the high resistance state HRS. However, in the nonvolatile memory device 20 according to the embodiment, the medium resistance state MRS does not change in a discontinuous and stepwise manner, but changes substantially continuously.

That is, the resistance increases with the increase of application voltage. The specific example schematically shows the resistance linearly changing in the medium resistance state MRS. However, the change of resistance in the medium resistance state MRS is arbitrary.

In the nonvolatile memory device 20 including the memory layer 220 with such characteristics, the voltage range from voltage $V_{O2}$ to voltage $V_{O3}$ can be divided into arbitrary segments. The segment can be used as a medium resistance state MRS. Then, a voltage corresponding to that segment can be applied. Thus, a method similar to that described in the first embodiment can be used to perform three-valued recording including the high resistance state HRS, the low resistance state LRS, and the medium resistance state MRS. Furthermore, the recorded information can be reproduced.

Furthermore, the range from voltage $V_{O2}$ to voltage $V_{O3}$ can be divided into a plurality of segments. The plurality of segments can be associated with a plurality of medium resistance states (first to Nth medium resistance states), respectively. In this case, a voltage corresponding to each medium resistance state can be applied. Thus, a method similar to that described in the first embodiment can be used to perform multivalued recording including the high resistance state HRS, the low resistance state LRS, and a plurality of medium resistance states. Furthermore, the recorded information can be reproduced.

The nonvolatile memory device 20 according to the embodiment can also provide a nonvolatile memory device of the resistance change type facilitating increasing the memory density, having high controllability, and being capable of multivalued recording.

Fourth Practical Example

In a nonvolatile memory device 20a according to a fourth practical example, the memory layer 220 was made of HfOx. More specifically, a film of Pt was formed as a lower electrode. Subsequently, an HfOx film serving as a memory layer 220 was formed by sputtering. Subsequently, a film of Pt was formed as an upper electrode. Then, with the lower electrode placed at the ground potential, a positive voltage was applied to the upper electrode to evaluate the current-voltage characteristics of the memory layer 220 under unipolar operation. The result is as follows.

Figure 11:
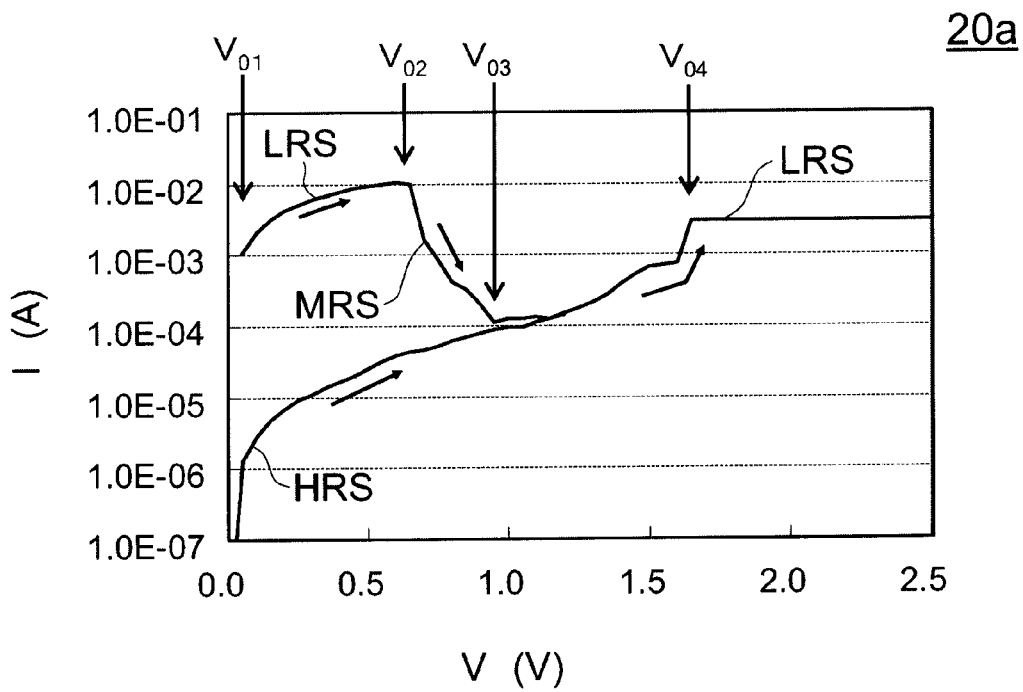
FIG. 11 is a graph illustrating the characteristics of a nonvolatile memory device according to a fourth practical example.

FIG. 11 is a graph illustrating the characteristics of the nonvolatile memory device according to the fourth practical example.

As shown in FIG. 11, in the nonvolatile memory device 20a according to the fourth practical example, a medium resistance state MRS occurs in the transfer from the low resistance state LRS to the high resistance state HRS with the increase of application voltage. The medium resistance state MRS changes substantially continuously. That is, the resistance increases with the increase of application voltage.

In this case, the ranges having different rates of change of resistance in response to the change of voltage can be 0-0.65 V (low resistance state LRS), 0.75-0.8 V (medium resistance state MRS), 1.2-1.5 V (high resistance state HRS), and 1.6 V or more (low resistance state LRS).

Then, for instance, voltage V1 is set to 0.3 V, voltage V2 is set to 0.78 V, voltage V3 is set to 1.3 V, and voltage V4 is set to 1.7 V. Under the condition illustrated in TABLE 1, for instance, the voltages are applied to the memory layer 220. Thus, any state of the high resistance state HRS, the medium resistance state MRS, and the low resistance state LRS can be recorded and reproduced.

In the foregoing, the number of medium resistance states MRS is one. However, a plurality of medium resistance states MRS may be established.

Third Embodiment

Figure 12:
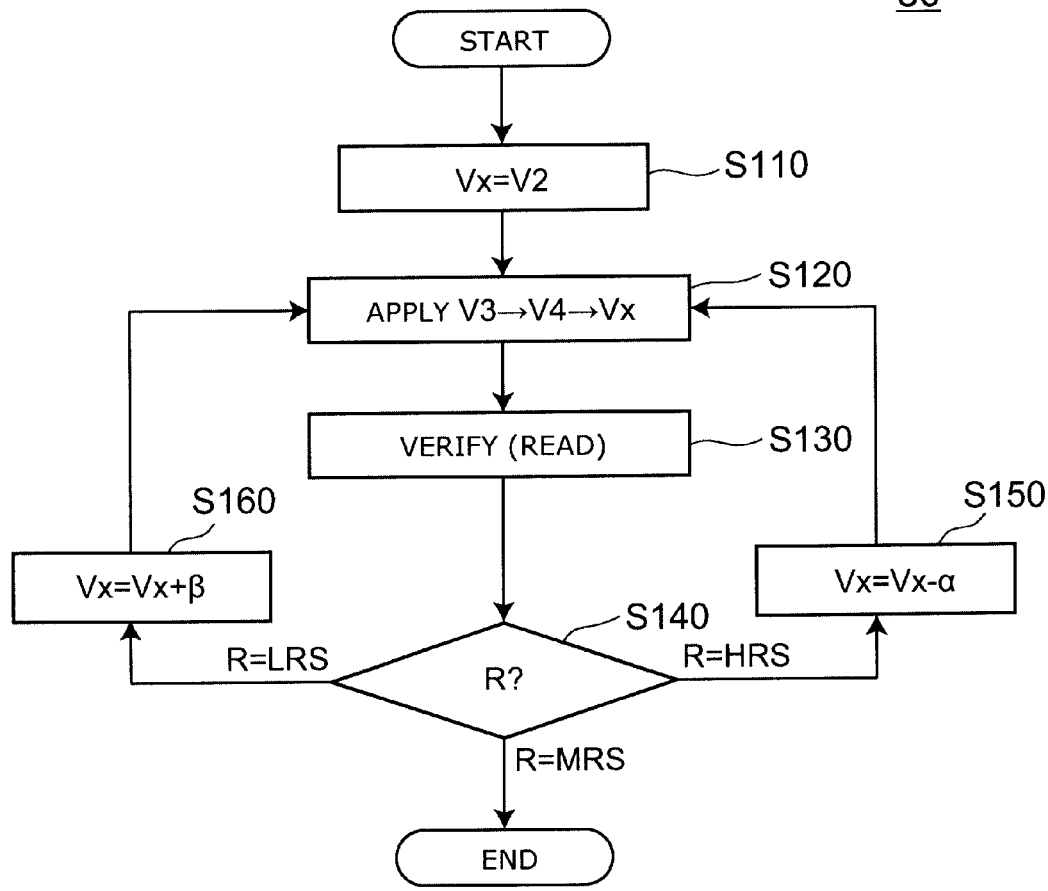
FIG. 12 is a flow chart illustrating the operation of a nonvolatile memory device according to a third embodiment.

FIG. 12 is a flow chart illustrating the operation of a nonvolatile memory device 30 according to a third embodiment.

The nonvolatile memory device 30 according to the third embodiment is characterized in the operation of writing the medium resistance state MRS.

More specifically, as shown in FIG. 12, in writing the medium resistance state MRS, first, the application voltage Vx is set to e.g. voltage V2 having a value in the range from voltage $V_{O2}$ to voltage $V_{O3}$ illustrated in FIG. 1 (step S110). The voltage $V_{O2}$ and the voltage $V_{O3}$ correspond to the maximum voltage exhibiting the low resistance state LRS and the minimum voltage exhibiting the high resistance state HRS, respectively, in the process of change from the low resistance state LRS to the high resistance state HRS with the increase of voltage.

Then, voltage V3 is applied, and subsequently voltage V4 is applied. Then, the aforementioned Vx is applied (step S120, first step).

Then, the state written by Vx is read (reproduced) for verification (step S130, second step).

As a result, if the written state is the medium resistance state MRS, the operation is ended (step S140).

If the written state is the high resistance state HRS, the application voltage Vx is set to a value obtained by decreasing the initial application voltage by a prescribed voltage α (step S150).

Then, returning to step S120, after applying voltage V3 and then applying voltage V4, the aforementioned application voltage Vx decreased by voltage α is applied. Then, this is repeated.

On the other hand, in step S140, if the written state is the low resistance state LRS, the application voltage Vx is set to a value obtained by increasing the initial application voltage by a prescribed voltage β (step S160).

Then, returning to step S120, after applying voltage V3 and then applying voltage V4, the aforementioned application voltage Vx increased by voltage β is applied. Then, this is repeated.

Thus, the medium resistance state MRS can be reliably recorded. The aforementioned steps S130 and S140 constitute one pass of verification.

The aforementioned voltages α and β can be arbitrarily determined. Furthermore, in the aforementioned repetition of steps S120-S160, these voltages may be varied based on the number of repetitions. For instance, the voltage β can be set smaller than the voltage α. Specifically, the voltage β can be set to half the voltage α.

The aforementioned operation can be used not only in the case where there is one medium resistance state MRS, but also in the case where there are a plurality of medium resistance states. Then, when the resistance state read in step S130 is determined in step S140, the determination is made by comparing it with the values of the first to Nth medium resistance states.

Thus, the nonvolatile memory device 30 according to the embodiment can provide a nonvolatile memory device of the resistance change type being capable of accurately recording three or more arbitrary multivalued data, facilitating increasing the memory density, and having high controllability.

In the foregoing, if the number of repetitions of steps S120-S160 (at least steps S120 and S130) exceeds a prescribed number of times, the memory layer 220 can be applied with a voltage (voltage V4) equal to or higher than the voltage ($V_{O4}$) at which the memory layer 220 changes from the high resistance state HRS to the low resistance state LRS. Then, the aforementioned steps S120 and S130 can be performed again.

More specifically, the memory layer 220 is not in the medium resistance state MRS to be written, but in a resistance state close to the medium resistance state MRS. In this case, it is difficult for the memory layer 220 to change from that state. Even if the aforementioned steps S120-S160 are repeated, the memory layer 220 may not transfer to the medium resistance state MRS to be written. In this case, the memory layer 220 is once transferred to the low resistance state LRS, and then steps S120-S160 are performed again. This facilitates realizing the medium resistance state MRS to be written.

In this case, in the second and subsequent repetition of steps S120-S160, at least one of the voltages α and β can be set to a value different from that in the previously performed steps S120-S160. Thus, the medium resistance state MRS to be written can be realized more efficiently.

The memory layer 220 used in the nonvolatile memory device 30 according to the embodiment can be any of the memory layers 220 having the characteristics described in the first and second embodiment.

Fourth Embodiment

In an information recording method according to a fourth embodiment, the memory layer 220 has a first state (low resistance state LRS) having a first resistance under application of a first voltage, a second state (high resistance state HRS) having a second resistance higher than the first resistance under application of a second voltage higher than the first voltage, and a third state (medium resistance state MRS) having a third resistance between the first resistance and the second resistance under application of a third voltage between the first voltage and the second voltage. At least one of the first voltage, the second voltage, and the third voltage is applied to the memory layer 220 to record information in the memory layer 220.

The information recording method according to the embodiment can provide an information recording method of the resistance change type facilitating increasing the memory density, having high controllability, and being capable of multivalued recording.

The resistance state of the memory layer 220 can be read. Based on the resistance state read, information can be recorded in the memory layer 220 by varying the voltage.

Furthermore, the memory layer 220 can be applied with a voltage (voltage V4) equal to or higher than the voltage ($V_{O4}$) at which the memory layer 220 changes from the high resistance state HRS to the low resistance state LRS. Then, the third voltage can be applied to the memory layer 220. That is, the voltage under the condition illustrated in TABLE 1 can be applied to the memory layer 220.

Furthermore, as illustrated in FIG. 12, in a first step, the memory layer 220 is applied with a voltage Vx having a value higher than the first voltage and lower than the second voltage. Subsequently, in a second step, the resistance state of the memory layer 220 is read. If the resistance read is in the high resistance state HRS, a value lower than the aforementioned Vx is defined as new Vx. If the resistance read is in the low resistance state LRS, a value higher than the aforementioned Vx is defined as new Vx. Then, the first step and the second step can be repeated to write the medium resistance state MRS.

Here, if the number of repetitions of the first step and the second step exceeds a prescribed number of times, the memory layer 220 can be applied with a voltage (voltage V4) equal to or higher than the voltage ($V_{O4}$) at which the memory layer 220 changes from the high resistance state HRS to the low resistance state LRS. Then, the first step and the second step can be performed.

The present embodiments provide a nonvolatile memory device and an information recording method of the resistance change type facilitating increasing the memory density, having high controllability, and being capable of multivalued recording.

The embodiments of the invention have been described above with reference to specific examples. However, the invention is not limited to these specific examples. For instance, any specific configurations of the components constituting the nonvolatile memory device and the information recording method are encompassed within the scope of the invention as long as those skilled in the art can similarly practice the invention and achieve similar effects by suitably selecting such configurations from conventionally known ones.

Furthermore, any two or more components of the specific examples can be combined with each other as long as technically feasible. Such combinations are also encompassed within the scope of the invention as long as they fall within the spirit of the invention.

Furthermore, those skilled in the art can suitably modify and implement the nonvolatile memory device and the information recording method described above in the embodiments of the invention. All the nonvolatile memory devices and the information recording methods thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
    a memory layer having:
        a first state having a first resistance under application of a first voltage;
        a second state having a second resistance higher than the first resistance under application of a second voltage higher than the first voltage; and a third state having a third resistance between the first resistance and the second resistance under application of a third voltage between the first voltage and the second voltage; and a driver section configured to apply at least one of the first voltage, the second voltage and the third voltage to the memory layer to record information in the memory layer.

2. The device according to claim 1, wherein the resistance of the memory layer changes discontinuously with increase of application voltage from the first voltage through the third voltage to the second voltage.

3. The device according to claim 1, wherein the resistance of the memory layer increases with increase of application voltage from the first voltage through the third voltage to the second voltage.

4. The device according to claim 3, wherein a voltage range higher than the first voltage and lower than the second voltage is defined, and the third voltage is set in the defined voltage range.

5. The device according to claim 1, wherein the driver section reads the resistance state of the memory layer and records information in the memory layer by varying the voltage based on the resistance state read.

6. The device according to claim 1, wherein after applying the memory layer with a voltage equal to or higher than a voltage at which the memory layer changes from the second state to the first state, the driver section applies the third voltage to the memory layer.

7. The device according to claim 1, wherein
the driver section performs a first step configured to apply the memory layer with a voltage Vx having a value higher than the first voltage and lower than the second voltage,
the driver section subsequently performs a second step configured to read the resistance state of the memory layer,
if the resistance read in the second step is in the second state, a value lower than the Vx is defined as new Vx,
if the resistance read in the second step is in the first state, a value higher than the Vx is defined as new Vx, and
the first step and the second step are repeated to write the third state.

8. The device according to claim 7, wherein absolute value of difference between the Vx in the first step and the new Vx in case of the resistance read in the second step being in the second state is larger than absolute value of difference between the Vx in the first step and the new Vx in case of the resistance read in the second step being in the first state.

9. The device according to claim 7, wherein if number of repetitions of the first step and the second step exceeds a prescribed number of times, then after applying the memory layer with a voltage equal to or higher than a voltage at which the memory layer changes from the second state to the first state, the driver section performs the first step and the second step.

10. The device according to claim 1, wherein the driver section applies the voltage to the memory layer by varying at least one of voltage, time width, waveform, and duty ratio of a pulse.

11. The device according to claim 1, further comprising:
a word line and a bit line sandwiching the memory layer,
wherein the driver section applies at least the one of the first voltage, the second voltage and the third voltage to the memory layer through the word line and the bit line.

12. The device according to claim 1, wherein the memory layer includes a compound including different kinds of metal elements and oxygen.

13. An information recording method comprising:
recording information in a memory layer having:
a first state having a first resistance under application of a first voltage;
a second state having a second resistance higher than the first resistance under application of a second voltage higher than the first voltage; and
a third state having a third resistance between the first resistance and the second resistance under application of a third voltage between the first voltage and the second voltage, by applying at least one of the first voltage, the second voltage and the third voltage to the memory layer.

14. The method according to claim 13, wherein the resistance of the memory layer increases with increase of application voltage from the first voltage through the third voltage to the second voltage.

15. The method according to claim 14, wherein a voltage range higher than the first voltage and lower than the second voltage is defined, and the third voltage is set in the defined voltage range.

16. The method according to claim 13, wherein the resistance state of the memory layer is read, and information is recorded in the memory layer by varying the voltage based on the resistance state read.

17. The method according to claim 13, wherein after applying the memory layer with a voltage equal to or higher than a voltage at which the memory layer changes from the second state to the first state, the third voltage is applied to the memory layer.

18. The method according to claim 13, wherein
a first step is performed, the first step being configured to apply the memory layer with a voltage Vx having a value higher than the first voltage and lower than the second voltage,
subsequently, a second step is performed, the second step being configured to read the resistance state of the memory layer,
if the resistance read in the second step is in the second state, a value lower than the Vx is defined as new Vx,
if the resistance read in the second step is in the first state, a value higher than the Vx is defined as new Vx, and
the first step and the second step are repeated to write the third state.

19. The method according to claim 18, wherein absolute value of difference between the Vx in the first step and the new Vx in case of the resistance read in the second step being in the second state is larger than absolute value of difference between the Vx in the first step and the new Vx in case of the resistance read in the second step being in the first state.

20. The method according to claim 18, wherein if number of repetitions of the first step and the second step exceeds a prescribed number of times, then after applying the memory layer with a voltage equal to or higher than a voltage at which the memory layer changes from the second state to the first state, the first step and the second step are performed.

* * * * *